(12) United States Patent
Suwald et al.

(10) Patent No.: US 10,990,785 B2
(45) Date of Patent: Apr. 27, 2021

(54) APPARATUS AND METHOD FOR MEASURING A CAPACITANCE, AND A FINGERPRINT SENSOR UTILIZING THE SAME

(71) Applicants: NXP B.V., Eindhoven (NL); Suresh Phadtare, Akkalkot (IN)

(72) Inventors: Thomas Suwald, Hamburg (DE);
Milind Phadtare, Bangalore (IN);
Dillip Kumar Routray, Bangalore (IN)

(73) Assignee: NXP B.V., Eindhoven (NL)

( * ) Notice: Subject to any disclaimer, the term of this patent is extended or adjusted under 35 U.S.C. 154(b) by 55 days.

(21) Appl. No.: 16/687,955

(22) Filed: Nov. 19, 2019

(65) Prior Publication Data
US 2020/0184175 A1 Jun. 11, 2020

(30) Foreign Application Priority Data

Dec. 5, 2018 (EP) .................................... 18210556

(51) Int. Cl.
| G06K 9/00 | (2006.01) |
| G01R 27/26 | (2006.01) |
| G06F 3/044 | (2006.01) |

(52) U.S. Cl.
CPC ....... *G06K 9/0002* (2013.01); *G01R 27/2605* (2013.01); *G06F 3/044* (2013.01)

(58) Field of Classification Search
CPC ........ G06F 3/044–0448; G06F 3/0416–04186; G06K 9/00006–0012; G06K 2009/0006
See application file for complete search history.

(56) References Cited

U.S. PATENT DOCUMENTS

| 7,460,697 B2 | 12/2008 | Erhart et al. |
| 7,664,476 B2 | 2/2010 | Yanagida |
| (Continued) | | |

FOREIGN PATENT DOCUMENTS

| KR | 101715630 B1 | 3/2017 |
| WO | WO-2015133773 A1 | 9/2015 |

OTHER PUBLICATIONS

Landberg, Anton et al.; "Detection and Suppression of Common-Mode Noise in Capacitive Fingerprint Sensors;" Master's Thesis; Chalmers University of Technology, Department of Computer Science and Engineering; University of Gotheburg, Sweden; 2016.
(Continued)

*Primary Examiner* — Patrick F Marinelli (57) ABSTRACT

There is described an apparatus for measuring a capacitance formed by a sense plate and a counter plate, wherein the sense plate comprises a first sub-plate and a second sub-plate, the first sub-plate and the second sub-plate being electrically separated. The apparatus comprises (a) a first integrator comprising a first integrator input terminal, a first integrator reference terminal connected to a first reference voltage, and a first integrator output terminal for providing a first output voltage indicative of a capacitance connected to the first integrator input terminal, (b) a second integrator comprising a second integrator input terminal, a second integrator reference terminal coupled to a second reference voltage, and a second integrator output terminal for providing a second output voltage indicative of a capacitance connected to the second integrator input terminal, (c) switching circuitry adapted to, at a first measurement point in time, connect the first integrator input terminal to the first sub-plate and connect the second integrator input terminal to the second sub-plate, and, at a second measurement point in time, connect the first integrator input terminal to the second sub-plate and connect the second integrator input terminal to
(Continued)

the first sub-plate, and (d) output circuitry coupled to the first integrator output terminal and the second integrator output terminal and adapted to generate an output signal based on a difference between the first output voltage and the second output voltage, the output signal being indicative of the capacitance formed by the sense plate and the counter plate. There is also described a fingerprint sensor and a method.

12 Claims, 8 Drawing Sheets

(56) References Cited

U.S. PATENT DOCUMENTS

| | | | |
|---|---|---|---|
| 7,864,992 | B2 | 1/2011 | Riedijk et al. |
| 8,854,107 | B2 * | 10/2014 | Kwon ................... G06G 7/184 327/337 |
| 9,310,953 | B1 | 4/2016 | Maharyta |
| 9,372,582 | B2 | 6/2016 | Brunet et al. |
| 9,519,819 | B2 | 12/2016 | Hansen et al. |
| 9,671,253 | B2 * | 6/2017 | Entringer ............. G01P 15/125 |
| 9,747,489 | B2 * | 8/2017 | Mo ................... G06K 9/00107 |
| 9,785,822 | B2 * | 10/2017 | Lee ....................... H05K 1/0296 |
| 10,205,895 | B2 * | 2/2019 | Lin ........................ H04N 5/378 |
| 10,558,302 | B2 * | 2/2020 | Shahparnia ........... G06F 3/0443 |
| 10,579,851 | B2 * | 3/2020 | Suwald ................ G06K 9/0002 |
| 10,627,959 | B2 * | 4/2020 | Jiang ..................... G01R 27/26 |
| 10,706,250 | B2 * | 7/2020 | Chen .................... G06K 9/0008 |
| 10,846,503 | B2 * | 11/2020 | Suwald .............. G06K 9/00053 |
| 2015/0244699 | A1 | 8/2015 | Hessler |
| 2015/0338952 | A1 * | 11/2015 | Shahparnia ............. G06F 3/044 345/174 |
| 2016/0011014 | A1 * | 1/2016 | Entringer .............. G01P 15/125 324/661 |
| 2016/0379032 | A1 * | 12/2016 | Mo ..................... G06K 9/00107 382/124 |
| 2018/0144170 | A1 | 5/2018 | Suwald |
| 2018/0218192 | A1 * | 8/2018 | Suwald .................... G01D 5/24 |
| 2018/0330138 | A1 * | 11/2018 | Suwald ................ G06K 9/0002 |
| 2019/0014274 | A1 * | 1/2019 | Lin ........................ H04N 5/374 |
| 2019/0196654 | A1 * | 6/2019 | Jiang ..................... G06F 3/0416 |
| 2019/0213375 | A1 * | 7/2019 | Suwald .................... G06F 21/32 |
| 2019/0286868 | A1 * | 9/2019 | Suwald ................ G06K 9/0002 |
| 2020/0184175 | A1 * | 6/2020 | Suwald .............. G01R 27/2605 |
| 2020/0210046 | A1 * | 7/2020 | Lee ..................... G06F 3/04182 |

OTHER PUBLICATIONS

Ghogare, Shraddha D. et al., "Location Based Authentication: A New Approach Towards Providing Security;" International Journal of Scientific and Research Publications; vol. 2, No. 4, IJSRP, Gurgaon, India; Apr. 2012 Edition.

Kuseler, Torben et al., "Using Geographical Location as an Authentication Factor to Enhance mCommerce Applications on Smartphones;" International Journal of Computer Science and Security (IJCSS); Published Aug. 10, 2012; vol. 6, No. 4.

U.S. Appl. No. 16/685,206; Inventor, Thomas Suwald; Title: "Location- and Identity-Referenced Authentication Method and Communication System;" Filed Nov. 15, 2019.

* cited by examiner

APPARATUS AND METHOD FOR MEASURING A CAPACITANCE, AND A FINGERPRINT SENSOR UTILIZING THE SAME

CROSS-REFERENCE TO RELATED APPLICATIONS

This application claims priority under 35 U.S.C. § 119 to European Patent Application No. 18210556.9, filed on Dec. 5, 2018, the contents of which are incorporated by reference herein.

FIELD OF THE INVENTION

The present invention relates to the field of capacitance measurement, in particular to an apparatus and a method for measuring a capacitance formed by a sense plate and a counter plate. The present invention further relates to a fingerprint sensor utilizing the apparatus and method.

ART BACKGROUND

Integration of a capacitance measurement device into a mains-operated device may cause noise being coupled into the device and hence impact the measurement result. Capacitance measurement devices that may e.g. measure the capacitance between parts of a human body and an array of sensing electrodes, may exhibit performance issues caused by noise originating from switched mode power supplies or picked-up RF noise being coupled between the device's ground potential and the body potential. Such noise may modulate the bottom plate of the capacitor under test, resulting in measurement errors.

Thus, there may be a need for a simple and efficient way of suppressing the noise discussed above.

SUMMARY OF THE INVENTION

This need may be met by the subject matter according to the independent claims. Advantageous embodiments of the present invention are set forth in the dependent claims.

According to a first aspect there is provided an apparatus for measuring a capacitance formed by a sense plate and a counter plate, wherein the sense plate comprises a first sub-plate and a second sub-plate, the first sub-plate and the second sub-plate being electrically separated. The apparatus comprises (a) a first integrator comprising a first integrator input terminal, a first integrator reference terminal connected to a first reference voltage, and a first integrator output terminal for providing a first output voltage indicative of a capacitance connected to the first integrator input terminal, (b) a second integrator comprising a second integrator input terminal, a second integrator reference terminal coupled to a second reference voltage, and a second integrator output terminal for providing a second output voltage indicative of a capacitance connected to the second integrator input terminal, (c) switching circuitry adapted to, at a first measurement point in time, connect the first integrator input terminal to the first sub-plate and connect the second integrator input terminal to the second sub-plate, and, at a second measurement point in time, connect the first integrator input terminal to the second sub-plate and connect the second integrator input terminal to the first sub-plate, and (d) output circuitry coupled to the first integrator output terminal and the second integrator output terminal and adapted to generate an output signal based on a difference between the first output voltage and the second output voltage, the output signal being indicative of the capacitance formed by the sense plate and the counter plate.

This aspect is based on the idea that performing a first parallel and simultaneous integration for electrically separate sub-plates can be used to cancel time-variant common mode noise and that performing a (subsequent) second parallel and simultaneous integration with interchanged sub-plates can be used to further cancel time-invariant errors introduced by the spatial separation of the sense plate into sub-plates, in particular by size differences among the sub-plates. Thereby, a high precision capacitance measurement can be obtained.

In operation, the first and second integrators perform at first pair of integrations (beginning at the first measurement point in time) while the first integrator is coupled to the first sub-plate and the second integrator is coupled to the second sub-plate. Thereafter, the first and second integrators continue with performing a second pair of integrations (beginning at the second measurement point in time) while the first integrator is coupled to the second sub-plate and the second integrator is coupled to the first sub-plate. In other words, the sub-plates are interchanged during the second integrations. As a result, both integrators (i.e. the first integrator and the second integrator) perform a two-stage integration corresponding to the complete sense plate. More specifically, the first integrator first integrates while connected to the first sub-plate and then while connected to the second sub-plate, whereas the second integrator first integrates while connected to the second sub-plate and then while connected to the first sub-plate. The output circuitry then subtracts the integration results, i.e. it determines a difference between the first output voltage and the second output voltage, and uses the difference to determine the output signal indicative of the capacitance formed by the sense plate (first and second sub-plates) and the counter plate.

According to an embodiment, the output circuitry is further adapted to generate the output signal based on a difference between the first reference voltage and the second reference voltage.

By applying different reference voltages to the first and second integrators and assuming that the common mode noise is constant during the integration, it can be shown that the common mode noise is cancelled out when subtracting the integration results.

According to a further embodiment, the switching circuitry is further adapted to connect the first sub-plate and the second sub-plate to a ground potential prior to the first measurement point in time and prior to the second measurement point in time.

By grounding the sub-plates prior to each integration, it is assured that the corresponding capacitors are completely discharged.

According to a further embodiment, the first integrator comprises a first operational transconductance amplifier and a first integrator capacitor, and the second integrator comprises a second operational transconductance amplifier and a second integrator capacitor.

According to a further embodiment, the first integrator input terminal is connected to an inverting input of the first operational transconductance amplifier, the first integrator reference terminal is connected to the non-inverting input of the first operational transconductance amplifier, the first integrator output terminal is connected to an output terminal of the first operational transconductance amplifier, and the first integrator capacitor is arranged between the first integrator input terminal and the first integrator output terminal.

The second integrator input terminal is connected to an inverting input of the second operational transconductance amplifier, the second integrator reference terminal is connected to the non-inverting input of the second operational transconductance amplifier, the second integrator output terminal is connected to an output terminal of the second operational transconductance amplifier, and the second integrator capacitor is arranged between the second integrator input terminal and the second integrator output terminal.

According to a further embodiment, the switching circuitry is further adapted to short the first integrator capacitor and the second integrator capacitor prior to the first measurement point in time.

Thereby, both the first and second integrator capacitor is discharged prior to the first integration.

According to a further embodiment, the apparatus further comprises a coupling capacitor arranged between the counter plate and ground.

By choosing the coupling capacitor to have an appropriately large capacitance, a correspondingly large coupling capacitance may be created between the device's ground and the counter plate of the capacitor which capacitance is being measured. This will additionally attenuate the common mode noise.

According to a further embodiment, the apparatus further comprises a reference voltage generator for providing a reference voltage, and circuitry for providing the first reference voltage and the second reference voltage in linear dependency of the reference voltage.

By deriving both the first and second reference voltage from a common reference voltage generator by linear dependency, time variant variations of the first and second reference voltages can be regarded as common mode variations, such that the overall reduction of common mode noise is further improved.

According to a second aspect, there is provided a fingerprint sensor comprising (a) a plurality of sense plates arranged in a matrix structure, each sense plate comprising a respective first sub-plate and a respective second sub-plate that are electrically separated, and (b) an apparatus according to any of the preceding claims, wherein the switching circuitry is adapted to selectively connect the first and second integrators to one of the plurality of sense plates.

This aspect is based on the idea of using the apparatus according to the first aspect or one of the above embodiments to obtain a representation of a fingerprint by sequentially measuring a plurality of capacitances. The capacitances are arranged in a matrix structure, i.e. a structure with m rows and n columns, and the sense plate of each capacitance is divided into first and second sub-plates.

According to an embodiment, each first sub-plate has substantially the same size as the corresponding second sub-plate.

Ideally, the first and second sub-plates should be equally sized. However, as long as their sizes are substantially equal, i.e. as close to being equal as practically possible, the double integration approach of the present invention will compensate for the size difference and deliver a very precise capacitance value with negligible errors caused by common mode noise.

According to a further embodiment, each first sub-plate comprises a plurality of interconnected first sub-sub-plates and each second sub-plate comprises a plurality of interconnected second sub-sub-plates.

More specifically, the first sub-plate may be formed by a plurality of first sub-sub-plates which are physically separated both electrically interconnected, e.g. by wiring. Similarly, the second sub-plate may be formed by a plurality of second sub-sub-plates which are physically separated both electrically interconnected. Preferably, the first and second sub-sub-plates are arranged in a matrix structure such each first sub-sub-plate is neighbored by a second sub-sub-plate in both row and column directions. This structure will provide an averaging effect that may further increase the precision of the capacitance measurement.

According to a third aspect, there is provided a method of measuring a capacitance formed by a sense plate and a counter plate, wherein the sense plate comprises a first sub-plate and a second sub-plate, the first sub-plate and the second sub-plate being electrically separated. The method comprises (a) at a first measurement point in time, connecting a first integrator input terminal of a first integrator to the first sub-plate and connecting a second integrator input terminal of a second integrator to the second sub-plate, (b) at a second measurement point in time, connecting the first integrator input terminal to the second sub-plate and connecting the second integrator input terminal to the first sub-plate, (c) wherein the first integrator further comprises a first integrator reference terminal connected to a first reference voltage, and a first integrator output terminal for providing a first output voltage indicative of a capacitance connected to the first integrator input terminal, and (d) wherein the second integrator further comprises a second integrator reference terminal coupled to a second reference voltage, and a second integrator output terminal for providing a second output voltage indicative of a capacitance connected to the second integrator input terminal, the method further comprising (e) generating an output signal based on a difference between the first output voltage and the second output voltage, the output signal being indicative of the capacitance formed by the sense plate and the counter plate.

This aspect is generally based on the same idea as the first aspect discussed above.

It should be noted that embodiments of the invention have been described with reference to different subject matters. In particular, some embodiments have been described with reference to method type claims whereas other embodiments have been described with reference to apparatus type claims. However, a person skilled in the art will gather from the above and the following description that, unless otherwise indicated, in addition to any combination of features belonging to one type of subject matter also any combination of features relating to different subject matters, in particular a combination of features of the method type claims and features of the apparatus type claims, is also disclosed with this document.

The aspects defined above and further aspects of the present invention will be apparent from the examples of embodiment to be described hereinafter and are explained with reference to the examples of embodiment. The invention will be described in more detail hereinafter with reference to examples of embodiment to which the invention is, however, not limited.

DETAILED DESCRIPTION

The illustration in the drawing is schematic. It is noted that in different figures, similar or identical elements are provided with the same reference signs or with reference signs, which differ only within the first digit.

Figure 1:
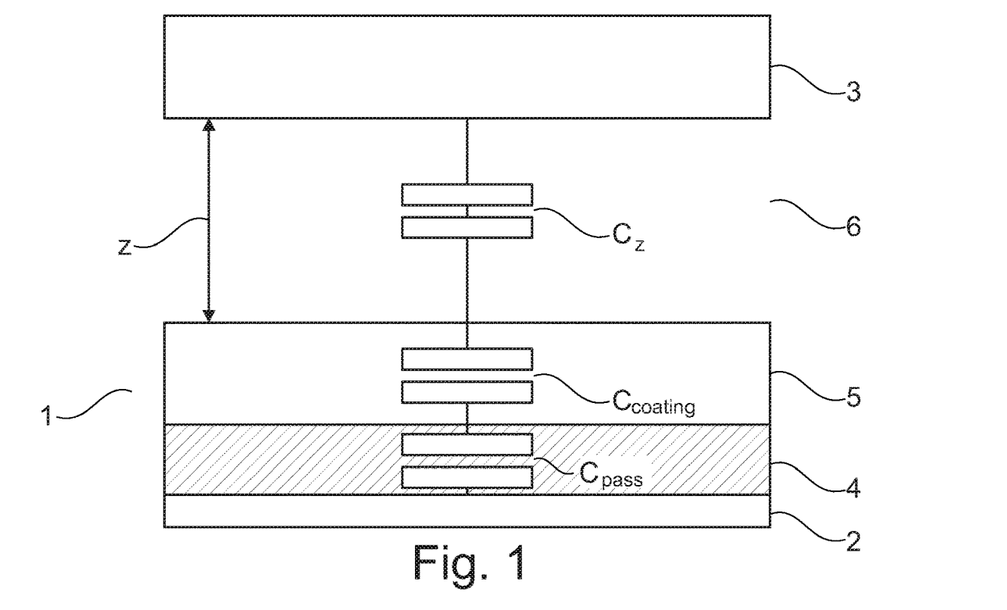
FIG. 1 shows the structure of a capacitive sensor element.

FIG. 1 shows the structure of a capacitive sensor element 1. More specifically, the sensor element 1 comprises a sense plate 2 (or sense electrode) facing a counter plate 3 (which may be the surface of a conductive object, such as e.g. a user's finger) such that the sense plate 2 and the counter plate 3 form opposing plates of a capacitor. The surface of the sense plate 2 that faces the counter plate 3 is covered with a passivation layer 4 having a capacitance $C_{pass}$ and a coating 5 having a capacitance $C_{coating}$. Furthermore, an air gap 6 having a capacitance $C_z$ is present between the coating 5 and the counter plate 3. As known in the art, the width z of the air gap 6 influences the overall capacitance of the resulting capacitor (i.e., the capacitance between the sense plate 2 and the counter plate 3). By using a large number of small sense plates 2 arranged in a matrix structure, the spatial distribution of the width z of the air gap 6 may be obtained as a representation of e.g. a fingerprint.

Figure 2:
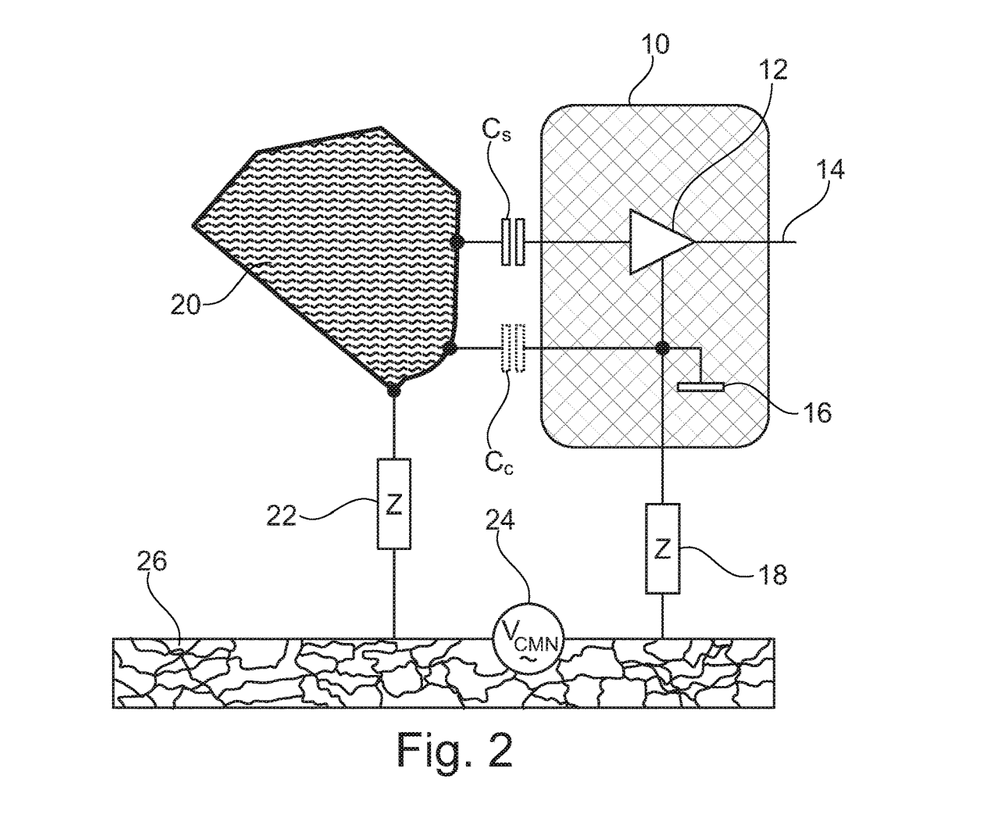
FIG. 2 shows an equivalent circuit diagram of the coupling between a capacitive sensor in an electronic device, an electrically conductive object and ground.

FIG. 2 shows an equivalent circuit diagram of the coupling between a capacitive sensor in an electronic device 10, an electrically conductive object 20 and ground 26.

Furthermore, FIG. 2 shows the coupling of a common mode noise source 24 (illustrated as an AC voltage source $V_{CMN}$) to the capacitance measurement device. A capacitance-to-digital converter 12 may convert the capacitance $C_S$ developing between a sense cap electrode and the surface of the conductive object 20 relative to the device's circuit ground 16 into a digital representation 14 that may be utilized for further processing. The device 10 itself may be coupled through a coupling impedance 18, that may e.g. comprise a winding capacitance of a transformer, to earth ground potential 26. The conductive object 20 may also be coupled through an earth coupling impedance 22 to earth ground potential 26. The common mode noise source 24 may be schematically coupled between the object coupling impedance 22 and the device coupling impedance 18. Here, it is irrelevant whether the noise source 24 is coupled between the measurement device 10 and earth 26 or between the conductive object 20 and earth 26 or even between different locations of earth. The common mode noise source 24 may appear to be series connected with the capacitance $C_S$ between the sense cap electrode and the conductive object 20.

The common mode noise source 24 may comprise noise components like mains hum, periodic noise originating from switched-mode-power-supplies (SMPS), RF noise or other random, pseudo-random or periodic noise signals, and thereby impacting the Capacitance-to-Digital conversion quality.

In order to reduce the common mode noise, a coupling capacitor Cc may optionally be arranged between the conductive object 20 and the device's circuit ground 16.

Figure 3:
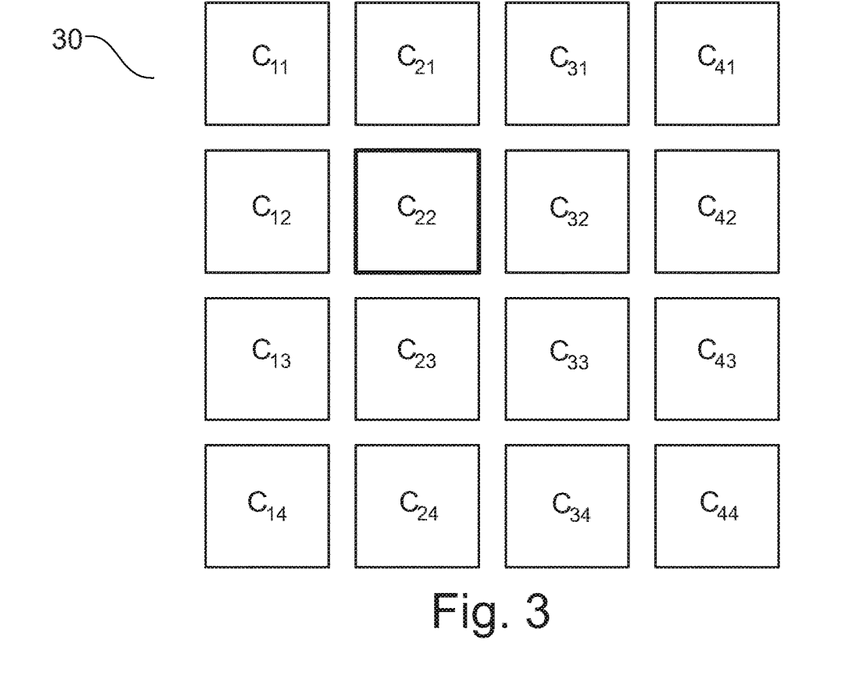
FIG. 3 shows a plurality of capacitive sensing plates arranged in a matrix structure.

FIG. 3 shows a plurality of capacitive sensing plates arranged in a matrix structure 30. For illustrative purposes, the matrix structure 30 is shown to comprise a total of 16 sensing plates C11-C44 arranged in four rows and four columns. It is emphasized that, depending on the specific application, the number of sensing plates may be significantly higher. The capacitance between a sense plate in the matrix structure 30 and a conductive object may, as also discussed above, be indicative of the surface topology of the conductive object. In other words, by performing separate capacitance measurements involving all sense caps of the sensing matrix 30, the resulting capacitance measurement results may be indicative of the topology of the conductive object. This relationship may be utilized to obtain a scan of the surface of a three-dimensional conductive object, such as e.g. a human finger.

Figure 4:
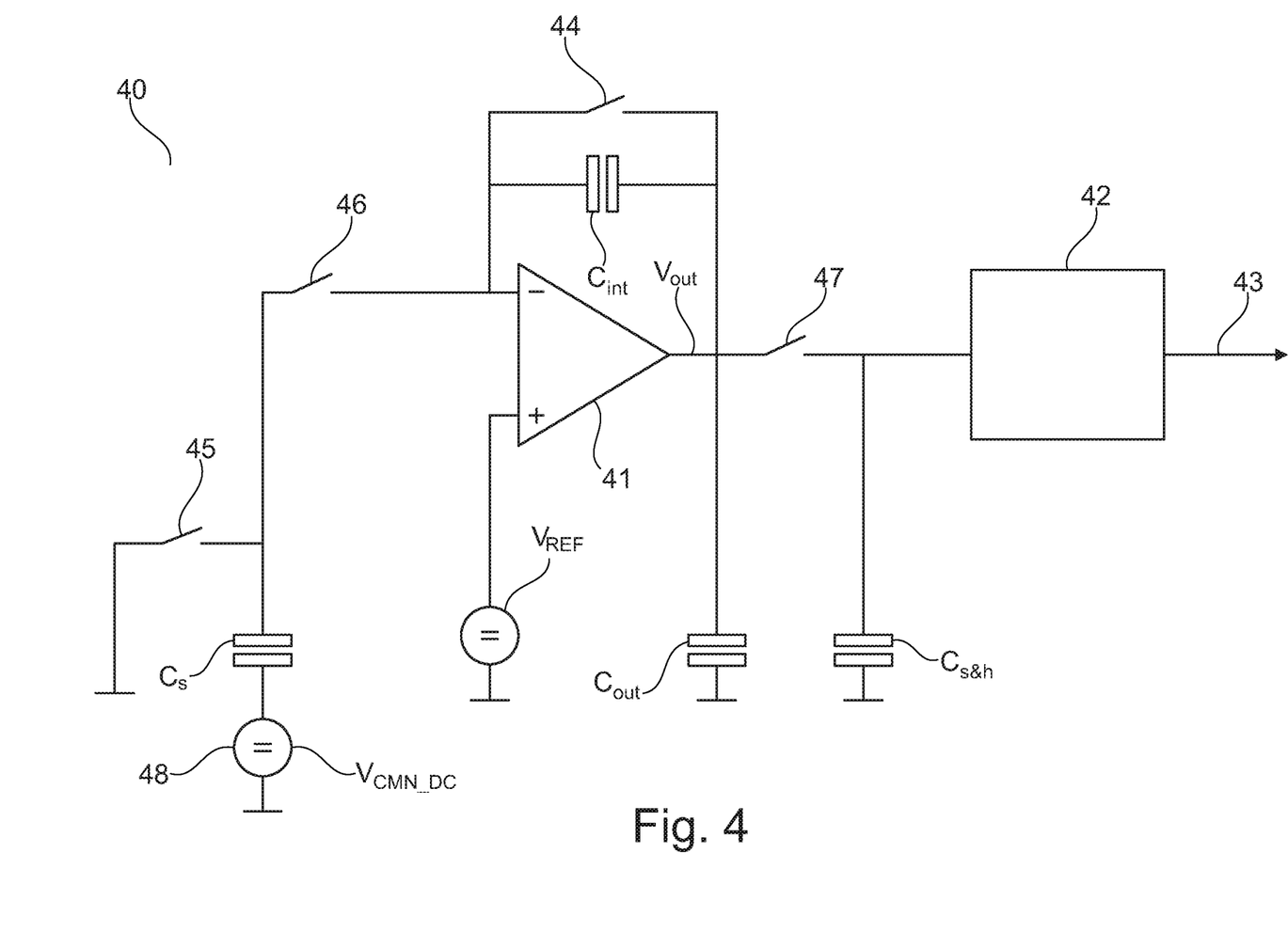
FIG. 4 shows a principal diagram of a device for measuring a capacitance.

FIG. 4 shows a principal diagram of a device 40 for measuring a capacitance $C_S$. More specifically, the device 40 is a switched capacitor integrator comprising an operational transconductance amplifier (OTA) 41 which may be utilized to convert the capacitance $C_S$ developing between a sense cap and the surface of the conductive object into an output voltage $V_{out}$ indicative of the capacitance $C_S$. The output voltage $V_{out}$ may be converted by means of an analog-to-digital converter 42 into a computer readable representation 43 indicative of the measured capacitance.

Ideally, no source of common mode noise is present and for the purpose of initial explanations, the common mode noise source 48 shown in FIG. 4 is therefore ignored. In operation, initial integration conditions are set by opening all switches 44, 45, 46, and 47 and then resetting the integrator by closing switch 44 which will shortcut the integration capacitor $C_{int}$. All parasitic capacitances at the negative input of the OTA are set to the reference voltage $V_{REF}$. At the same time, switch 45 is also closed which will cause discharge of the capacitance $C_S$ developing between the sense cap electrode and the surface of the conductive object. When discharge is complete, switches 44 and 45 are opened again. Now, to activate the integration, switch 46 is closed. This causes the OTA 41 to provide charge through the integration capacitor $C_{int}$ into capacitor $C_S$ as long as there is a voltage difference between the positive (non-inverting) input of the OTA 41 and the negative (inverting) input. At the end of the integration cycle, the charge accumulated by $C_{int}$ is $$Q = V_{ref} * C_s$$

while the voltage across the integration capacitor is $$V_{int} = V_{ref} * \frac{C_s}{C_{int}}$$

Thus, the output voltage $V_{out}$ of the OTA will be given as:

$$V_{out} = V_{ref} * \left(1 + \frac{C_s}{C_{int}}\right)$$

When the integration is complete, sample and hold switch 47 is closed and the output voltage is converted by ADC 42 and output as a digital value 43.

With regard to common mode noise, it may be assumed that the coupling impedances 18 and 22 (see FIG. 1) mainly comprise capacitive and ohmic components with resistances below 5 kOhm and have much lower impedances than the capacitor $C_s$. Thus, as shown in FIG. 4, the common mode noise source 48 may be directly coupled between the surface of the conductive object (i.e. the bottom plate of capacitor $C_s$) and the sense cap electrode (i.e. the top plate of capacitor $C_s$). Furthermore, presuming that the sampling frequency is close to the highest noise frequency component, the common mode noise may be regarded as static (pseudo-static) during one sampling (integration) interval. This means that during one sampling interval, the common mode noise 48 may, as shown in FIG. 4, be constituted by a DC voltage $V_{CMN\_DC}$.

The voltage $V_{CMN\_DC}$ may have a similar effect as a pre-charge being stored on capacitor $C_s$, thus causing a false integration voltage that may be misinterpreted as a wrong capacitance value. As the voltage $V_{CMN\_DC}$ is unknown, it needs to be eliminated from the capacitance measurement result. To eliminate $V_{CMN\_DC}$, it is required to establish a linear equation system with $V_{CMN\_DC}$ and $C_s$ as independent variables. To solve this equation system, two equations (corresponding to two measurements) are required.

There may be at least two options to eliminate the voltage $V_{CMN\_DC}$. Prior art proposes to superimpose the voltage $V_{CMN\_DC}$ by a two-level DC-drive voltage $V_{DRIVE}$ combined with double correlated sampling of the output signal. A drawback of this approach is, that the voltage $V_{CMN\_DC}$ will most likely change between two sam3ple moments.

Figure 5:
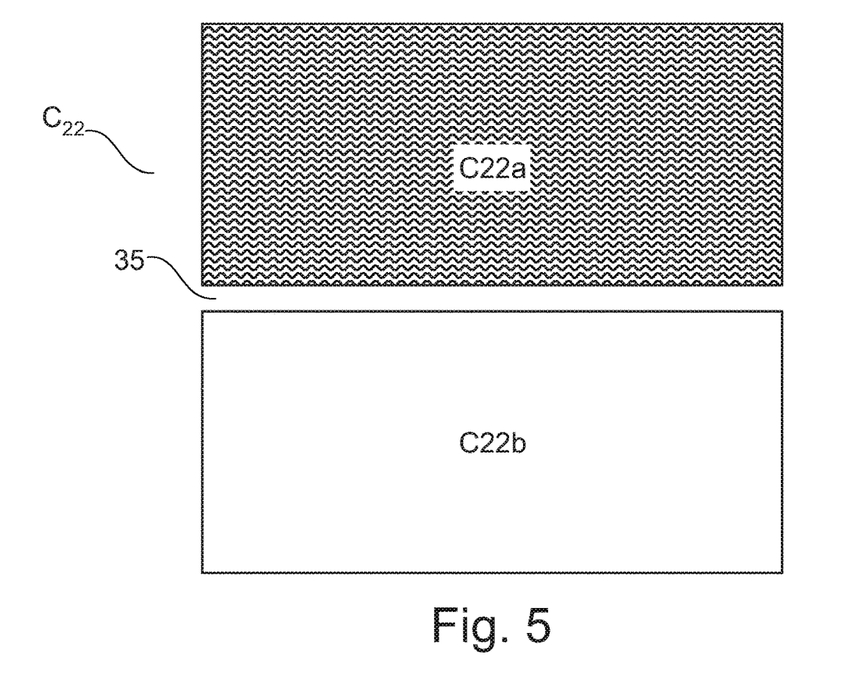
FIG. 5 shows a capacitive sensing plate comprising two sub-plates.

The present invention provides a better solution without the above drawbacks. More specifically, it is proposed to split each sense plate, such as sense plate C22 shown in FIG. 3, into a multiple of two sub-plates. FIG. 5 shows such a capacitive sensing plate C22 comprising two sub-plates, i.e. a first sub-plate C22$a$ and a second sub-plate C22$b$, which are electrically separated by a small gap 35. To eliminate $V_{CMN\_DC}$, the capacitance for each sub-plate C22$a$, C22$b$ may be measured simultaneously by two separate integrators, each integrator corresponding to the one shown in FIG. 4. More specifically, assuming that $$C_{22a} = C_{22b} = \frac{C_{22}}{2} = \frac{C_s}{2}$$

and $$V_{out} = V_{ref} + (V_{ref} - V_{CMN_{DC}}) * \frac{C_s}{2*C_{int}}$$

$$V_{out} = V_{ref} * \left(1 + \frac{C_s}{2*C_{int}}\right) - V_{CMN_{DC}} * \frac{C_s}{2*C_{int}}$$

the following equations may be setup:

$$V_{out_1} = V_{ref_1} * \left(1 + \frac{C_s}{2*C_{int}}\right) - V_{CMN_{DC}} * \frac{C_s}{2*C_{int}}$$

$$V_{out_2} = V_{ref_2} * \left(1 + \frac{C_s}{2*C_{int}}\right) - V_{CMN_{DC}} * \frac{C_s}{2*C_{int}}$$

The difference between $V_{out1}$ and $V_{out2}$ now yields:

$$V_{out_1} - V_{out_2} = (V'_{ref_1} - V_{ref_2}) * \left(1 + \frac{C_s}{2*C_{int}}\right)$$

Thus, by subtracting $V_{out2}$ from $V_{out1}$, the unknown common mode voltage component $V_{CMN\_DC}$ may be removed. However, the approach as disclosed so far relies on the assumption that $$C_{22a} = C_{22b} = \frac{C_{22}}{2}$$

which may not be true in reality, as the plate geometries of $C_{22a}$ and $C_{22b}$, the shape of the corresponding counter electrode and/or the distance to the corresponding counter electrode may vary which may cause $$C_{22a} \neq C_{22b} \neq \frac{C_{22}}{2}$$

The present invention corrects such capacitance differences between the formed capacitors $C_{ia}$ and $C_{ib}$ by double sampling. More specifically, two sets of measurements may be performed at two consecutive measurement points in time (sample moments), t=$t_1$ and t=$t_2$ (differential double sampling). As discussed above, two measurements performed at one sample moment may cancel the impact of the time-variant common mode noise component. Additionally, the different sample moments are utilized to cancel the time-invariant differences between the formed capacitors $C_a = C_{ia}$ and $C_b = C_{ib}$, wherein $$C_a \approx \frac{C_s}{2} \text{ and } C_b \approx \frac{C_s}{2}.$$

The common mode noise component at sample moment t=$t_1$ may be $$V_{CMN_{DC_1}}$$

and the common mode noise component at sample moment t=$t_2$ may be $$V_{CMN_{DC_2}}.$$

The OTA output voltages for both sample moments and two measurements per sample moment yields:

$$V_{out_{C_{a_{t1}}}} = V_{ref_1} * \left(1 + \frac{C_a}{C_{int}}\right) - V_{CMN_{DC_1}} * \frac{C_a}{C_{int}}$$

$$V_{out_{C_{b_{t1}}}} = V_{ref_2} * \left(1 + \frac{C_b}{C_{int}}\right) - V_{CMN_{DC_1}} * \frac{C_b}{C_{int}}$$

$$V_{out_{C_{a_{t2}}}} = V_{ref_2} * \left(1 + \frac{C_a}{C_{int}}\right) - V_{CMN_{DC_2}} * \frac{C_a}{C_{int}}$$

$$V_{out_{C_{b_{t2}}}} = V_{ref_1} * \left(1 + \frac{C_b}{C_{int}}\right) - V_{CMN_{DC_2}} * \frac{C_b}{C_{int}}$$

Summing up terms with the same reference voltages then gives:

$$V_{out_{C_{a_{t1}}}} + V_{out_{C_{b_{t2}}}} =$$

$$V_{ref_1} * \left(2 + \frac{C_a + C_b}{C_{int}}\right) - \frac{(V_{CMN_{DC_1}} * C_a) + (V_{CMN_{DC_2}} * C_b)}{C_{int}}$$

$$V_{out_{C_{b_{t1}}}} + V_{out_{C_{a_{t2}}}} =$$

$$V_{ref_2} * \left(2 + \frac{C_a + C_b}{C_{int}}\right) - \frac{(V_{CMN_{DC_2}} * C_a) + (V_{CMN_{DC_1}} * C_b)}{C_{int}}$$

Subtracting the sum terms yields:

$$(V_{out_{C_{a_{t1}}}} + V_{out_{C_{b_{t2}}}}) - (V_{out_{C_{b_{t1}}}} + V_{out_{C_{a_{t2}}}}) =$$

$$(V_{ref_1} - V_{ref_2}) * \left(2 + \frac{C_a + C_b}{C_{int}}\right) - \frac{(V_{CMN_{DC_1}} * C_a) + (V_{CMN_{DC_2}} * C_a) + (V_{CMN_{DC_2}} * C_b) - (V_{CMN_{DC_1}} * C_b)}{C_{int}}$$

$$(V_{out_{C_{a_{t1}}}} + V_{out_{C_{b_{t2}}}}) - (V_{out_{C_{b_{t1}}}} + V_{out_{C_{a_{t2}}}}) =$$

$$\left(2 + \frac{C_a + C_b}{C_{int}}\right) * (V_{ref_1} - V_{ref_2}) - \frac{C_a - C_b}{C_{int}} * (V_{CMN_{DC_1}} - V_{CMN_{DC_2}})$$

The output voltage variation $|\Delta V_{out}|$ caused by common-mode-noise may be calculated as:

$$|\Delta V_{out}| = \frac{|C_a - C_b|}{C_a + C_b} * \frac{|V_{CMN_{DC_1}} - V_{CMN_{DC_2}}|}{|V_{ref_1} - V_{ref_2}|}$$

Estimating the deviation $$\frac{C_a - C_b}{C_a + C_b} \text{ by } 5\%, (V_{ref_1} - V_{ref_2})$$

by 0,7V and $$(V_{CMN_{DC_1}} - V_{CMN_{DC_2}})$$

by 0.2V results in:

$$\Delta V_{out} = 5\% * \frac{0,2 \text{ V}}{0,7 \text{ V}} = 0,014$$

$$a[dB] = 20 * \log(0,014) dB = -36,9 \text{ dB}$$

These estimated parameters should be considered exemplary and merely serve to give an impression of the magnitude of common-mode-noise suppression that may be achieved by modifying these parameters. A skilled person will appreciate that $|\Delta V_{out}|$ may be minimized by maximizing $|V_{ref1}-V_{ref2}|$. More specifically, a larger $|V_{ref1}-V_{ref2}|$ will improve the signal-to-noise ratio (SNR) since the difference of two sub-plates is sensed, which gets compensated by having a larger difference in Vref, thereby improving the SNR. The reference voltage $V_{ref1}$ and $V_{ref2}$ may be derived from a common reference voltage $V_{ref}$ as indicated below:

$$V_{ref1} = 2 * V_{ref}$$

$$V_{ref1} = V_{ref}$$

Thus $$|V_{ref1} - V_{ref2}| = 2 * V_{ref} - V_{ref} = V_{ref}$$

Comparing the result against the result of single sample moment measurements it may be stated that (1) The output voltage is amplified by a factor of ≈2, which may compensate a loss of sensitivity by splitting the sense plate into two parts (sub-plates), and (2) The output error may be minimized by minimizing the difference between the capacitances $C_a$ and $C_b$ and/or maximizing the difference between the reference voltages $V_{ref1}$ and $V_{ref2}$.

Figure 6:
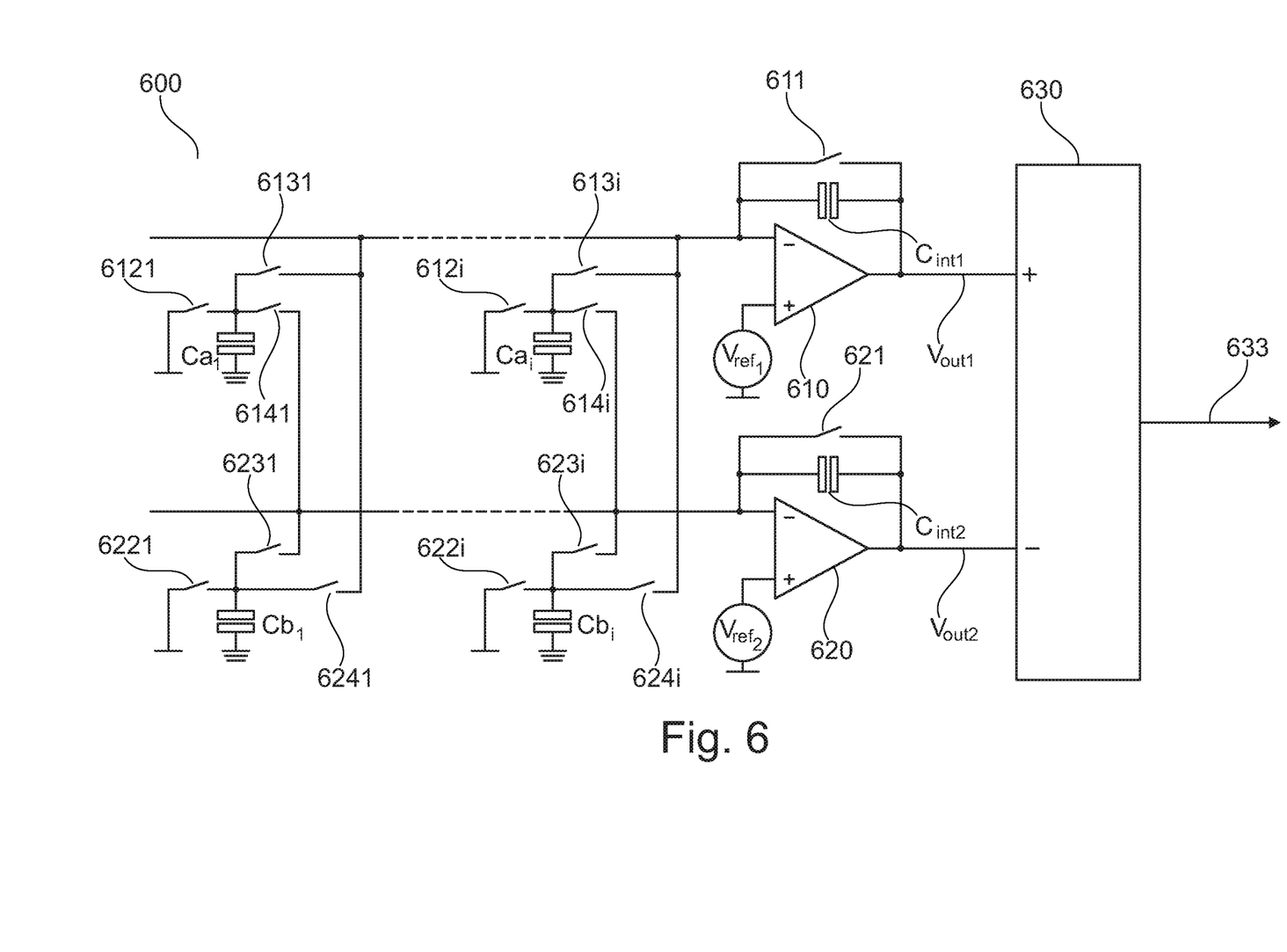
FIG. 6 shows a diagram of an apparatus for measuring capacitances in accordance with an embodiment.

FIG. 6 shows a circuit diagram of an apparatus 600 for measuring capacitances in accordance with an exemplary embodiment. More specifically, the apparatus 600 comprises a first integrator, a second integrator, switching circuitry, and output circuitry 630 for providing a digital output signal 633 indicative of a measured capacitance, i.e. a capacitance formed by one of a plurality of pairs of sub-plates Ca1, Cb1, . . . Cai, Cbi, where each pair of sub-plates form a split sense plate as shown in FIG. 5, and a counter plate (not shown). It may be further noted, that the larger the number i may be made, the smaller the impact of the counter electrode's shape variation and/or the counter electrode's distance variation on Cai and Cib will be.

The first integrator comprises a first operational transconductance amplifier 610 and a first integrator capacitor $C_{int1}$ coupled between the inverting input of the first OTA 610 and the output $Vout_1$ of the first OTA 610. A first reference voltage $Vref_1$ is applied to the non-inverting input of the first OTA 610.

Similarly, the second integrator comprises a second OTA 620 and a second integrator capacitor $C_{int2}$ coupled between the inverting input of the second OTA 620 and the output $Vout_2$ of the second OTA 620. A second reference voltage $Vref_2$ is applied to the non-inverting input of the second OTA 620. The second reference voltage $Vref_2$ differs from the first reference voltage $Vref_1$.

The switching circuitry comprises switches 611 and 621 for discharging the respective integrator capacitors $C_{int1}$ and $C_{int2}$, switches 6121 to 612i and 6221 to 622i for grounding the respective sub-plates in order to discharge the corresponding capacitors, and switches 6131 to 613i, 6141 to 614i, 6231 to 623i, and 6241 to 624i for selectively coupling the sub-plates to either the inverting input of the first OTA 610 or the inverting input of the second OTA 620. The various switches of the switching circuitry are operated in accordance with a number of control signals, which will be discussed in further detail below.

The output circuitry 630 receives the first output voltage $Vout_1$ and the second output voltage $Vout_2$, performs a sample and hold operation, a subtraction operation and an analog to digital conversion in order to generate the digital output signal 633 based on the differences $Vout_2-Vout_1$ and $Vref_2-Vref_1$ as discussed above.

Figure 7:
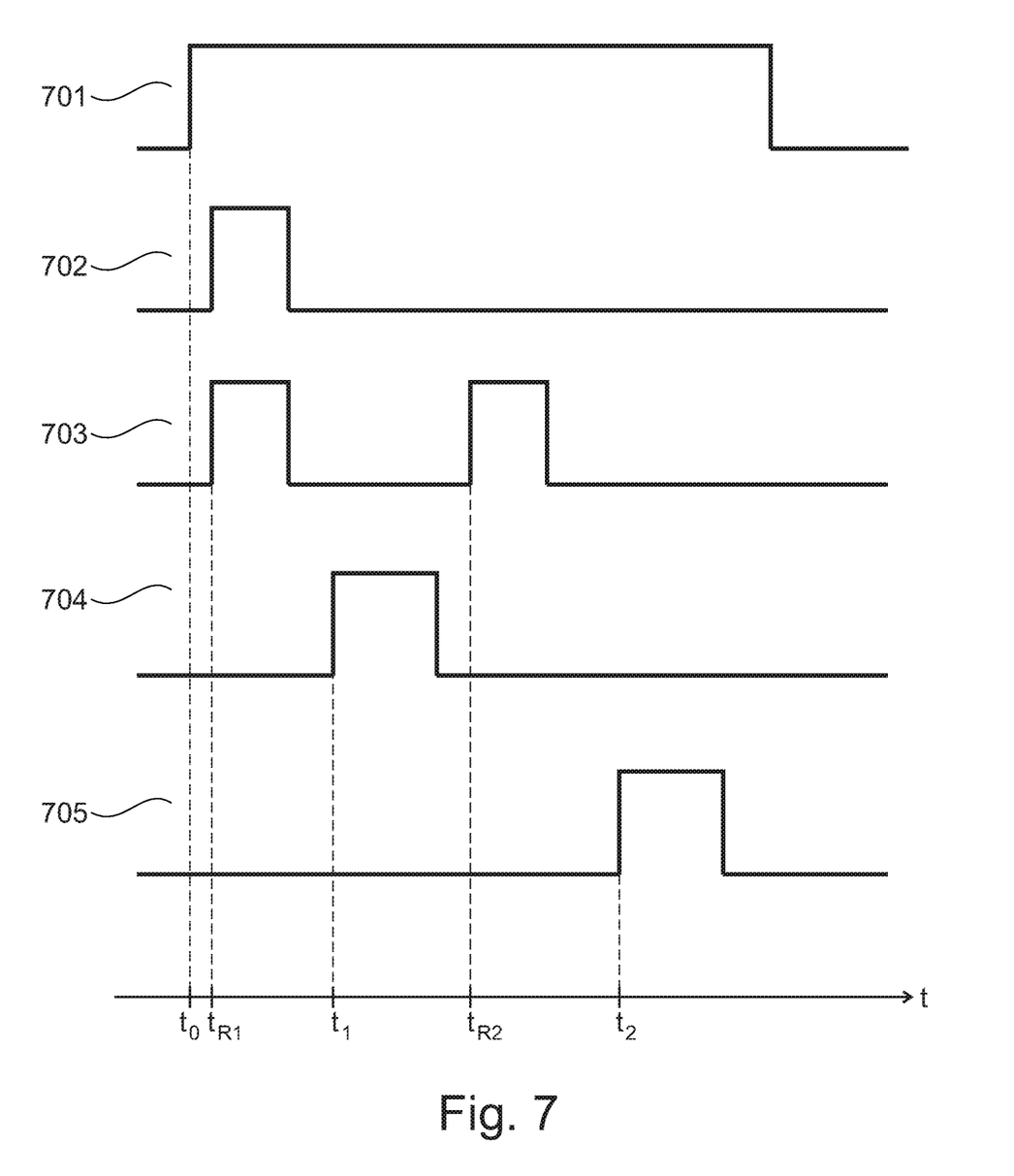
FIG. 7 shows control signals for operating the apparatus shown in FIG. 6 in accordance with an embodiment.

FIG. 7 shows control signals 701, 702, 703, 704, and 705 for operating the apparatus shown in FIG. 6 in accordance with an exemplary embodiment. More specifically, control signal 701 is a pixel selection signal for selecting one of the i pairs of capacitors, e.g. Ca1, Cb1, for measurement at time $t=t_0$. Control signal 702 controls the switches 611 and 621 to close at $t=t_{R1}$, shortly after $t=t_0$, such the first and second integrator capacitors $C_{int1}$ and $C_{int2}$ are both completely discharged. Similarly, control signal 703 controls the switches 612 and 622 corresponding to the selected pair of capacitors, e.g. switches 6111 and 6211, to close at time $t=t_{R1}$, such that both capacitors are completely discharged. Once the integrator capacitors and the selected capacitors are discharged, control signals 702 and 703 are deactivated and the corresponding switches are opened again. The apparatus is now initialized and ready for measurement. The first of two consecutive measurements is initiated by control signal 704 at a first measurement point in time, $t=t_1$, by closing switches 6131 and 6231 such that the sense plate of capacitor Ca1 is connected to the inverting input of the first OTA 610 and the sense plate of capacitor Cb1 is connected to the inverting input of the second OTA 620. Once the charging of the capacitors is complete and the respective output voltages Vout$_1$ and Vout$_2$ have settled, control signal 704 is deactivated and switches 6131 and 6231 are opened. Then, at $t=tR_2$, the control signal 703 closes switches 6121 and 6221 again in order to discharge capacitors Ca$_1$ and Cb$_1$ in preparation for the second measurement operation which starts at a second measurement point in time, $t=t_2$. Here, control signal 705 is activated and closes switches 6141 and 6241 such that the sense plate of capacitor Ca1 is now connected to the inverting input of the second OTA 620 and the sense plate of capacitor Cb1 is connected to the inverting input of the first OTA 610. In other words, the connection between the sense plates and the integrators is reversed in comparison to the first measurement period. Once the charging of the capacitors is complete and the respective output voltages Vout$_1$ and Vout$_2$ have settled, control signal 705 is deactivated and switches 6141 and 6241 are opened. In this way, both output voltages Vout$_1$ and Vout$_2$ correspond to the sum of two integrations, one for each sub-plate. The final output voltages Vout$_1$ and Vout$_2$ are sampled and held, subtracted and converted to digital output value 633 by the output circuitry 630 before the control signal 701 is deactivated again. Thereafter, the double measurement process is repeated for each of the other pairs of capacitors until output values 633 have been obtained for all of them.

Figure 8:
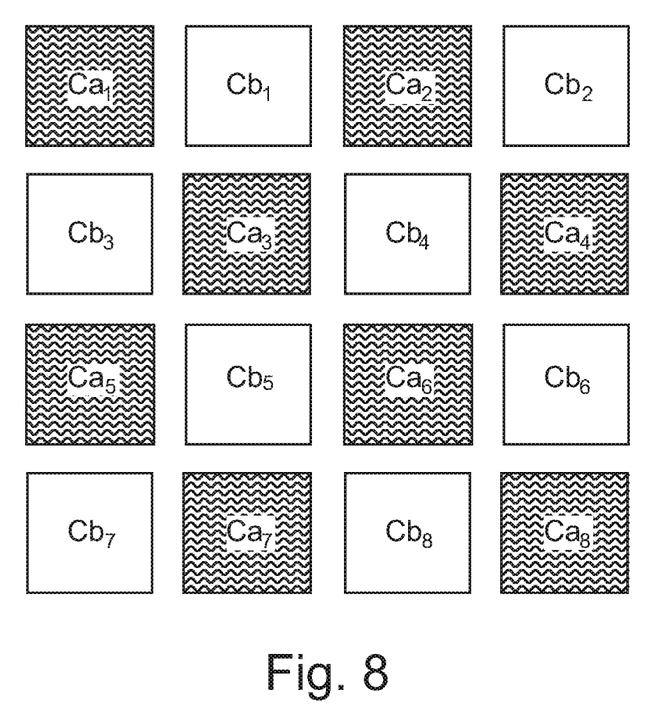
FIG. 8 shows a capacitive sensing plate comprising two groups of sub-plates in accordance with an embodiment.

FIG. 8 shows a capacitive sensing plate comprising two groups of sub-plates in accordance with an embodiment. More specifically, the first sub-plate Ca is split into eight sub-sub-plates Ca$_1$, Ca$_2$, Ca$_3$, Ca$_4$, Ca$_5$, Ca$_6$, Ca$_7$, and Ca$_8$ which are spatially separated but electrically interconnected. Similarly, the second sub-plate Cb is split into eight sub-sub-plates Cb$_1$, Cb$_2$, Cb$_3$, Cb$_4$, Cb$_5$, Cb$_6$, Cb$_7$, and Cb$_8$ which are also spatially separated but electrically interconnected. As shown, the sub-sub-plates are arranged in a matrix structure in such a way that the neighbors (in both rows and columns) belong to the other group of sub-sub-plates. The averaging resulting from this structure may help to improve the precision of the measurement result even further.

Figure 9:
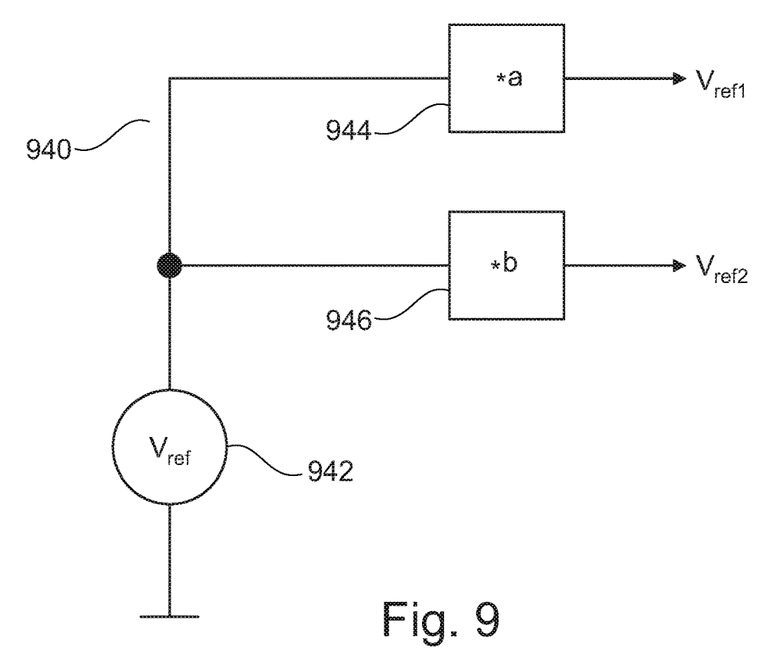
FIG. 9 shows a diagram of circuitry for generating reference voltages in accordance with an embodiment.

FIG. 9 shows a diagram of circuitry 940 for generating reference voltages Vref$_1$ and Vref$_2$ in accordance with an embodiment. More specifically, FIG. 9 shows generation of Vref$_1$ and Vref$_2$ by linear terms from a single reference voltage Vref 942, i.e. Vref$_1$=a*Vref and Vref$_2$=b*Vref. The factors a and b are respectively provided by voltage amplification circuits 944 and 946. This way of generating the reference voltages Vref$_1$ and Vref$_2$ provides the benefit that time variant variations of Vref$_1$ and Vref$_2$ are linearly related to the time variant variations of the single reference voltage Vref 942, thereby making the time variant variations of Vref$_1$ and Vref$_2$ common mode variations that may be regarded as part of the common mode noise component t, at sample moment $t=t_1$ as well as part of the common mode noise component t, at sample moment $t=t_2$.

Figure 10:
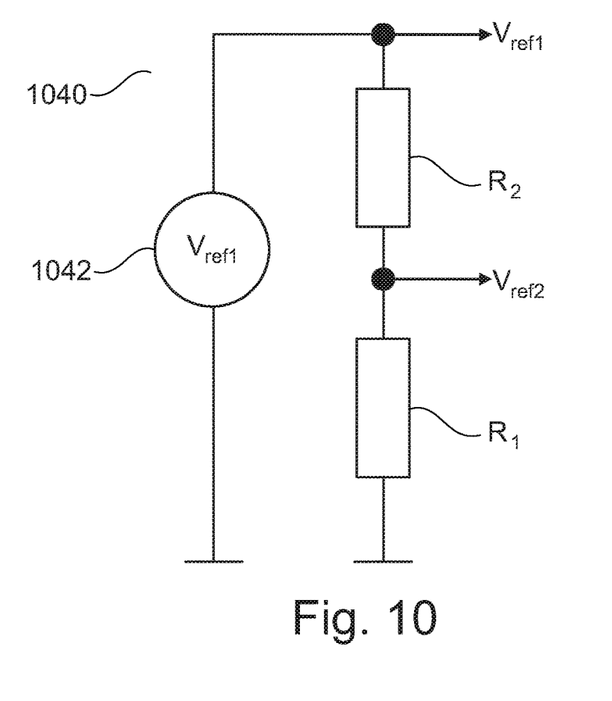
FIG. 10 shows a diagram of circuitry for generating reference voltages in accordance with an embodiment.

FIG. 10 shows a diagram of circuitry 1040 for generating reference voltages Vref$_1$ and Vref$_2$ in accordance with an embodiment and in line with the principle discussed above in conjunction with FIG. 9. More specifically, the first reference voltage Vref$_1$ is taken directly from voltage generator 1042 while the second reference voltage Vref$_2$ is obtained using a voltage divider comprising resistors R$_1$ and R$_2$, such that Vref$_2$=R$_1$/(R$_1$+R$_2$)*Vref$_1$.

Figure 11:
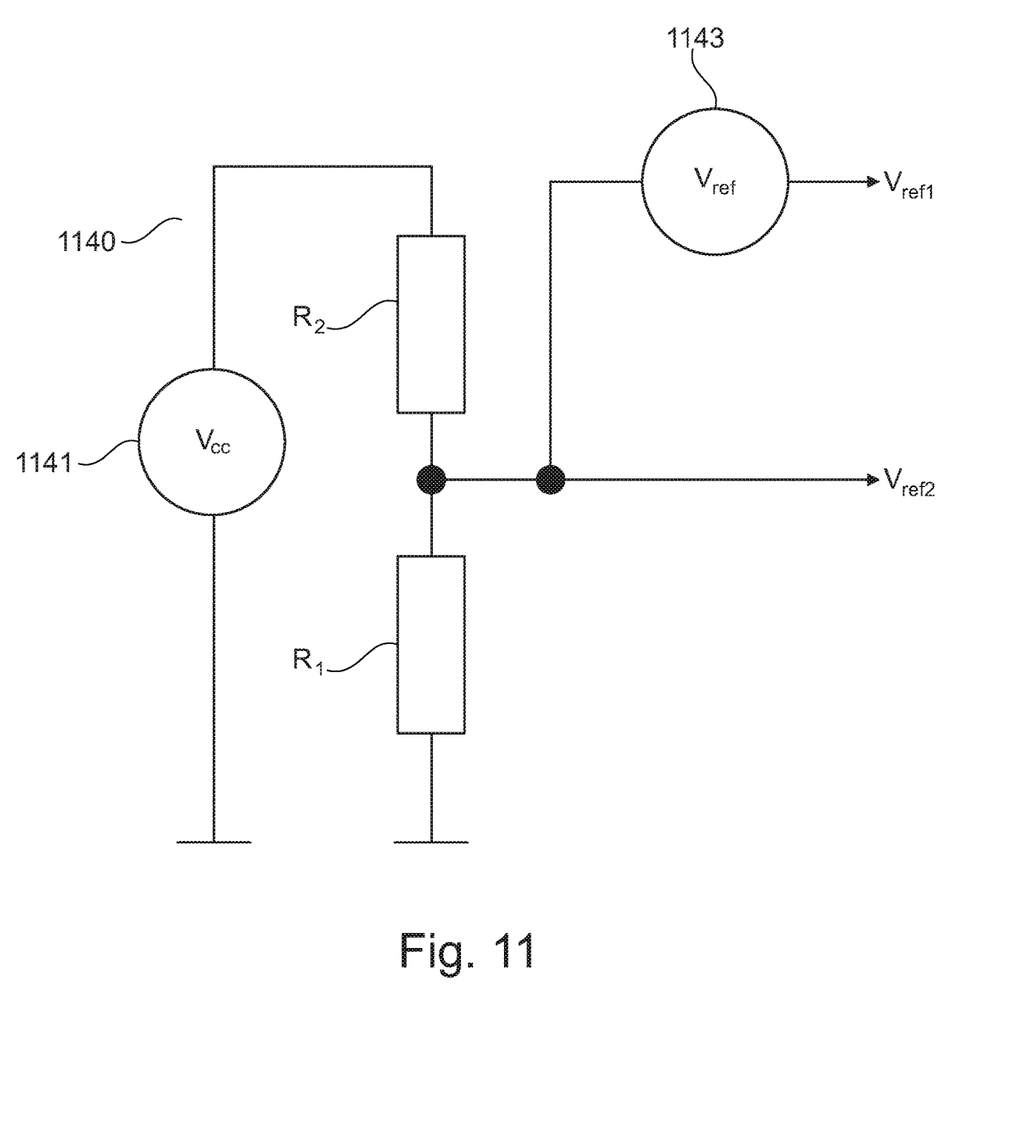
FIG. 11 shows a diagram of circuitry for generating reference voltages in accordance with an embodiment.

FIG. 11 shows a diagram of circuitry for generating reference voltages Vref$_1$ and Vref$_2$ in accordance with another embodiment, which is also in line with the principle discussed above in conjunction with FIG. 9. More specifically, two voltage sources 1141 and 1143 with voltages of respectively V$_{CC}$ and Vref, and a voltage divider comprising resistors R1 and R2 are used. Both the first reference voltage Vref$_1$ and the second reference voltage Vref$_2$ are derived from the divided voltage between R1 and R2. More specifically, the second reference voltage Vref$_2$ is taken directly from the divided voltage, i.e. Vref$_2$=R$_1$/(R$_1$+R$_2$)*V$_{CC}$, while the first reference voltage Vref$_1$ is obtained by subtracting the reference voltage Vref provided by voltage generator 1143 from the divided voltage, i.e. Vref$_1$=R$_1$/(R$_1$+R$_2$)*V$_{CC}$−Vref.

It is noted that, unless otherwise indicated, the use of terms such as "upper", "lower", "left", and "right" refers solely to the orientation of the corresponding drawing.

It is noted that the term "comprising" does not exclude other elements or steps and that the use of the articles "a" or "an" does not exclude a plurality. Also elements described in association with different embodiments may be combined. It should also be noted that reference signs in the claims should not be construed as limiting the scope of the claims.

The invention claimed is:

1. An apparatus for measuring a capacitance formed by a sense plate and a counter plate, wherein the sense plate comprises a first sub-plate and a second sub-plate, the first sub-plate and the second sub-plate being electrically separated, the apparatus comprising a first integrator comprising a first integrator input terminal, a first integrator reference terminal connected to a first reference voltage, and a first integrator output terminal for providing a first output voltage indicative of a capacitance connected to the first integrator input terminal, a second integrator comprising a second integrator input terminal, a second integrator reference terminal coupled to a second reference voltage, and a second integrator output terminal for providing a second output voltage indicative of a capacitance connected to the second integrator input terminal, switching circuitry adapted to, at a first measurement point in time, connect the first integrator input terminal to the first sub-plate and connect the second integrator input terminal to the second sub-plate, and, at a second measurement point in time, connect the first integrator input terminal to the second sub-plate and connect the second integrator input terminal to the first sub-plate, and output circuitry coupled to the first integrator output terminal and the second integrator output terminal and adapted to generate an output signal based on a difference between the first output voltage and the second output voltage, the output signal being indicative of the capacitance formed by the sense plate and the counter plate.

2. The apparatus according to claim 1, wherein the output circuitry is further adapted to generate the output signal based on a difference between the first reference voltage and the second reference voltage.

3. The apparatus according to claim 1, wherein the switching circuitry is further adapted to connect the first sub-plate and the second sub-plate to a ground potential prior to the first measurement point in time and prior to the second measurement point in time.

4. The apparatus according to claims 1,
wherein the first integrator comprises a first operational transconductance amplifier and a first integrator capacitor, and
wherein the second integrator comprises a second operational transconductance amplifier and a second integrator capacitor.

5. The apparatus according to claim 1,
wherein the first integrator input terminal is connected to an inverting input of the first operational transconductance amplifier, wherein the first integrator reference terminal is connected to the non-inverting input of the first operational transconductance amplifier, wherein the first integrator output terminal is connected to an output terminal of the first operational transconductance amplifier, and wherein the first integrator capacitor is arranged between the first integrator input terminal and the first integrator output terminal, and
wherein the second integrator input terminal is connected to an inverting input of the second operational transconductance amplifier, wherein the second integrator reference terminal is connected to the non-inverting input of the second operational transconductance amplifier, wherein the second integrator output terminal is connected to an output terminal of the second operational transconductance amplifier, and wherein the second integrator capacitor is arranged between the second integrator input terminal and the second integrator output terminal.

6. The apparatus according to claim 4, wherein the switching circuitry is further adapted to short the first integrator capacitor and the second integrator capacitor prior to the first measurement point in time.

7. The apparatus according to claim 1, further comprising a coupling capacitor arranged between the counter plate and ground.

8. The apparatus according to claim 1, further comprising
a reference voltage generator for providing a reference voltage, and
circuitry for providing the first reference voltage and the second reference voltage in linear dependency of the reference voltage.

9. A fingerprint sensor comprising
a plurality of sense plates arranged in a matrix structure, each sense plate comprising a respective first sub-plate and a respective second sub-plate that are electrically separated, and
an apparatus for measuring a capacitance formed by a sense plate of the plurality of sense plates and a counter plate, the apparatus comprising
a first integrator comprising a first integrator input terminal, a first integrator reference terminal connected to a first reference voltage, and a first integrator output terminal for providing a first output voltage indicative of a capacitance connected to the first integrator input terminal,
a second integrator comprising a second integrator input terminal, a second integrator reference terminal coupled to a second reference voltage, and a second integrator output terminal for providing a second output voltage indicative of a capacitance connected to the second integrator input terminal,
switching circuitry adapted to, at a first measurement point in time, connect the first integrator input terminal to the first sub-plate and connect the second integrator input terminal to the second sub-plate, and, at a second measurement point in time, connect the first integrator input terminal to the second sub-plate and connect the second integrator input terminal to the first sub-plate, and
output circuitry coupled to the first integrator output terminal and the second integrator output terminal and adapted to generate an output signal based on a difference between the first output voltage and the second output voltage, the output signal being indicative of the capacitance formed by the sense plate and the counter plate,
wherein the switching circuitry is adapted to selectively connect the first and second integrators to one of the plurality of sense plates.

10. The fingerprint sensor according to claim 9, wherein each first sub-plate has substantially the same size as the corresponding second sub-plate.

11. The fingerprint sensor according to claim 9, wherein each first sub-plate comprises a plurality of interconnected first sub-plates and each second sub-plate comprises a plurality of interconnected second sub-plates.

12. A method of measuring a capacitance formed by a sense plate and a counter plate, wherein the sense plate comprises a first sub-plate and a second sub-plate, the first sub-plate and the second sub-plate being electrically separated, the method comprising
at a first measurement point in time, connecting a first integrator input terminal of a first integrator to the first sub-plate and connecting a second integrator input terminal of a second integrator to the second sub-plate,
at a second measurement point in time, connecting the first integrator input terminal to the second sub-plate and connecting the second integrator input terminal to the first sub-plate,
wherein the first integrator further comprises a first integrator reference terminal connected to a first reference voltage, and a first integrator output terminal for providing a first output voltage indicative of a capacitance connected to the first integrator input terminal, and
wherein the second integrator further comprises a second integrator reference terminal coupled to a second reference voltage, and a second integrator output terminal for providing a second output voltage indicative of a capacitance connected to the second integrator input terminal,
the method further comprising
generating an output signal based on a difference between the first output voltage and the second output voltage, the output signal being indicative of the capacitance formed by the sense plate and the counter plate.

* * * * *